(12) United States Patent
Kusuda et al.

(10) Patent No.: US 10,622,980 B1
(45) Date of Patent: Apr. 14, 2020

(54) APPARATUS AND METHODS FOR SETTING AND CLAMPING A NODE VOLTAGE

(71) Applicant: ANALOG DEVICES, INC., Norwood, MA (US)

(72) Inventors: Yoshinori Kusuda, San Jose, CA (US); Gustavo Castro, North Andover, MA (US); Scott Andrew Hunt, Arlington, MA (US); Sean Patrick Kowalik, Chelmsford, MA (US); Simon Nicholas Fiedler Basilico, San Francisco, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/185,396

(22) Filed: Nov. 9, 2018

(51) Int. Cl.
*H03K 5/08* (2006.01)
(52) U.S. Cl.
CPC ..................................... *H03K 5/08* (2013.01)
(58) Field of Classification Search
None
See application file for complete search history.

(56) References Cited

U.S. PATENT DOCUMENTS

| | | | | |
|---|---|---|---|---|
| 4,945,265 A * | 7/1990 | Estrada | ................ | H03K 3/2885 326/59 |
| 6,433,609 B1 * | 8/2002 | Voldman | .................. | H03K 5/08 327/313 |
| 6,801,080 B1 | 10/2004 | Arcus | | |
| 7,288,993 B2 | 10/2007 | Brokaw | | |
| 7,863,981 B2 | 1/2011 | Shkidt et al. | | |
| 10,290,673 B1 * | 5/2019 | Wang | .................. | H04N 5/23241 |
| 2017/0093395 A1 * | 3/2017 | Huang | .................... | H03F 3/505 |
| 2018/0176497 A1 * | 6/2018 | Saha | ........................ | H04N 5/16 |

OTHER PUBLICATIONS

Analog Devices, Inc., AD53509 Data Sheet "High Performance Driver/Comparator, Active Load on a Single Chip" in 12 pages.
Analog Devices, Inc., AD5520 Data Sheet "Per Pin Parametric Measurement Unit/Source Measure Unit" in 24 pages.

* cited by examiner

*Primary Examiner* — Cassandra F Cox
(74) *Attorney, Agent, or Firm* — Knobbe, Martens, Olson & Bear, LLP (57) ABSTRACT

Apparatus and methods for setting and clamping a node voltage are provided herein. In certain embodiments, a node control circuit includes a setting circuit for setting a voltage of a node based on a set signal. The node control circuit further includes at least one of a p-type follower clamp for clamping the node to an upper voltage limit based on an upper clamping control signal or an n-type follower clamp for clamping the node to a lower voltage limit based on a lower clamping control signal. When including both clamps, the node operates with a voltage level set by the set signal, but saturates at the upper voltage limit established by the upper clamping control signal and at the lower voltage limit established by the lower clamping control signal.

20 Claims, 10 Drawing Sheets

APPARATUS AND METHODS FOR SETTING AND CLAMPING A NODE VOLTAGE

FIELD OF THE DISCLOSURE

Embodiments of the invention relate to electronic systems, and more particularly, to electronic circuits for controlling a voltage of a node.

BACKGROUND

Certain electronic devices employ amplifiers for driving a load. For example, an amplifier can drive the load with a controlled voltage and/or controlled current. Examples of amplifiers include, but are not limited to, operational amplifiers, transimpedance amplifiers, and transconductance amplifiers. Certain amplifiers are implemented in a multi-stage configuration to enhance gain and/or performance thereof.

SUMMARY OF THE DISCLOSURE

Apparatus and methods for setting and clamping a node voltage are provided herein. In certain embodiments, a node control circuit controls a voltage of a node based on a set signal indicating a desired voltage of the node, an upper clamping control signal for controlling an upper voltage limit of the node, and a lower clamping control signal for controlling a lower voltage limit of the node. Thus, the upper and lower clamping control signals establish a voltage range over which the node can operate without clamping, and the set signal controls the voltage of the node to a particular voltage level within the voltage range. When used in an impedance measurement application, the set signal controls a current or voltage applied to a device under test (DUT) to a desired level for measurement, and the upper and lower clamping control signals protect the DUT from inadvertent damage arising from excessive biasing conditions.

In one aspect, a node control circuit with controllable voltage operating range and set voltage is provided. The node control circuit includes a setting circuit electrically connected to a node and operable to control a voltage of the node within a voltage range. The setting circuit is configured to set the voltage of the node based on a set signal. The node control circuit further includes at least one clamping circuit configured to control the voltage range. The at least one clamping circuit includes a follower transistor clamp configured to receive a clamping control signal operable to adjust a voltage limit at which the follower transistor clamp activates to clamp the voltage of the node.

In another aspect, an electronic module is provided. The electronic module includes a module substrate, an amplifier die attached to the module substrate. The amplifier die includes a sensing circuit coupled to a load pin, a driving circuit configured to drive the load pin through the sensing circuit and controlled by a voltage of a node, and a node control circuit including a setting circuit and at least one clamping circuit. The setting circuit is configured to control the voltage of the node within a voltage range based on a set signal. The at least one clamping circuit is configured to control the voltage range. The at least one clamping circuit includes a follower transistor clamp configured to receive a clamping control signal operable to adjust a voltage limit at which the follower transistor clamp activates to clamp the voltage of the node.

In another aspect, a method of controlling a voltage operating range and set voltage of a node is provided. The method includes receiving a set signal indicating a desired operating voltage of a node, setting a voltage of the node within a voltage range based on the set signal using a setting circuit, and controlling the voltage range of the node using at least one clamping circuit, including adjusting a voltage limit provided by a follower transistor clamp based on a clamping control signal, and activating the follower transistor clamp to clamp the voltage of the node in response to the voltage of the node reaching the voltage limit.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for setting and clamping a node voltage are provided herein. In certain embodiments, a node control circuit includes a setting circuit for setting a voltage of a node based on a set signal. For example, the voltage of the node can be set by the set signal to control driving of a device under test (DUT) or other load. The node control circuit further includes at least one of a p-type follower clamp for clamping the node to an upper voltage limit based on an upper clamping control signal or an n-type follower clamp for clamping the node to a lower voltage limit based on a lower clamping control signal. When including both clamps, the node operates with a voltage level set by the set signal, but saturates at the upper voltage limit established by the upper clamping control signal and at the lower voltage limit established by the lower clamping control signal.

In certain implementations, the setting circuit is implemented to change the voltage of the node linearly with the set signal. For example, the setting circuit can include a current source that provides a current to a resistor to thereby set the node voltage. In such implementations, the current source and/or the resistor can be controllable by the set signal to provide flexibility in setting the node to a desired voltage.

The upper clamping control signal and the lower clamping control signal control a voltage range over which the node can operate without clamping. However, when the node voltage reaches the upper voltage limit set by the upper clamping control signal, the p-type follower clamp activates to clamp the node voltage to the upper voltage limit. Additionally, when the node voltage reaches the lower voltage limit set by the lower clamping control signal, the n-type follower clamp activates to clamp the node voltage to the lower voltage limit.

The p-type follower clamp includes one or more p-type transistors arranged as a follower. For instance, the p-type follower clamp can include at least one p-type field effect transistor (PFET) arranged as a source follower and/or at least one PNP bipolar transistor arranged as an emitter follower. Additionally, the n-type follower clamp includes one or more n-type transistors arranged as a follower. For instance, the n-type follower clamp can include at least one n-type field effect transistor (NFET) arranged as a source follower and/or at least one NPN bipolar transistor arranged as an emitter follower.

In certain implementations, the p-type follower clamp and/or the n-type follower clamp include one or more double-diffused metal-oxide-semiconductor (DMOS) transistors arranged as source followers. Using p-type and n-type DMOS transistors to implement source follower clamps allows the node to operate over a wide voltage range and/or permits the use of high voltage power supplies without risk of transistor damage.

In certain implementations, the p-type follower clamps include a pair of cross-connected p-type followers and/or the n-type follower clamp includes a pair of cross-connected n-type followers. Implementing the p-type follower clamp and/or the n-type follower clamp with cross-connected follower transistors provides enhanced robustness against overvoltage. For instance, in the context of metal-oxide-semiconductor (MOS) transistors, cross-connecting a pair of MOS transistor followers can limit gate-to-source voltages, thereby protecting the transistors from gate oxide breakdown.

To provide enhanced control of the lower voltage limit and/or the upper voltage limit, the p-type follower clamp and/or the n-type follower clamp can be implemented with an error amplifier for driving the input to a follower transistor. Including error amplifiers can provide precise control over the lower voltage limit and the upper voltage limit.

For example, in the context of an implementation using MOS transistors, including the error amplifiers compensates the lower voltage limit and the upper voltage limit for an offset corresponding to the threshold voltage of the MOS transistors. Additionally, in the context of an implementation using bipolar transistors, including the error amplifiers compensates the lower voltage limit and the upper voltage limit for an offset arising from the base-to-emitter voltage ($V_{BE}$) of the bipolar transistors.

In certain implementations, the node voltage controls an input to a driving circuit, which in turn drives a load. For example, the node voltage can control a non-inverting input of an amplifier that is connected with negative feedback, such as a unity-gain buffer. Thus, the node voltage can be used to control biasing of the load, such as a DUT.

In certain implementations, the node control circuit is connected using one or more feedback loops to provide control over the node voltage. For instance, the node voltage can control biasing of a load, and feedback to the setting circuit and/or follower clamp(s) can be controlled based on the current and/or voltage of the load. In a first example, feedback to the setting circuit is provided based on the current provided to the load, and feedback to the follower clamps is provided based on the voltage across the load. In a second example, feedback to the setting circuit is provided based on the voltage across the load, and feedback to the follower clamps is provided based on the current provided to the load.

When operating using feedback, the bandwidths of control loops used for the setting circuit, the p-type follower clamp, and/or the n-type follower clamp can be separately controlled. Independent control of loop bandwidth can provide flexibility in a wide range of applications, including, but not limited to, load control applications.

In certain implementations, the node control circuit is controlled by data received from an interface or bus, such as an inter-Integrated Circuit (I²C) bus, a General Purpose Input Output (GPIO) bus, and/or other suitable interface. For example, the data can serve to control at least one of the set signal, the upper clamping control signal, and/or the lower clamping control signal. In certain implementations, the node control circuit is fabricated on a semiconductor die or chip, and a user can digitally program desired values of the set signal, the upper clamping control signal, and/or the lower clamping control signal using the bus. Implementing the node control circuit in this manner provides a convenient and flexible mechanism for user configurability.

Figure 1A:
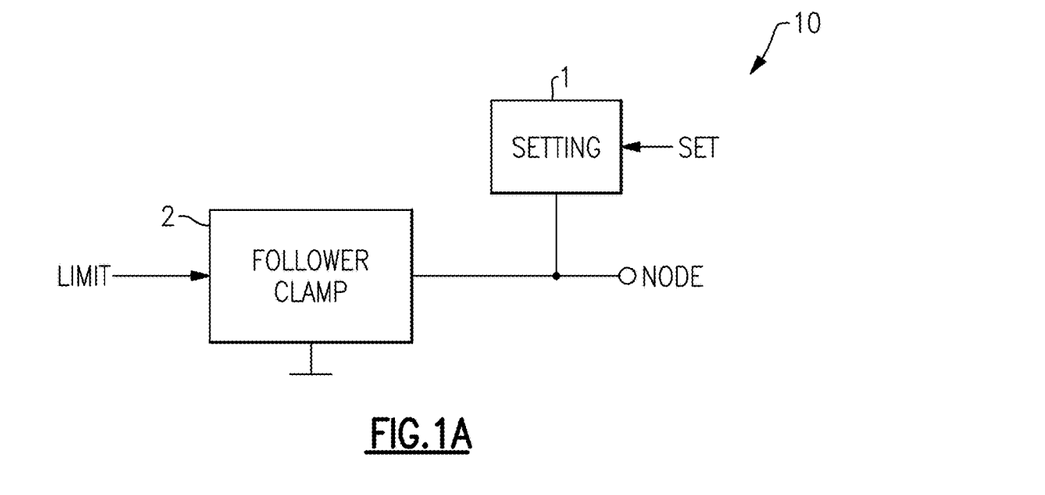
FIG. 1A is a schematic diagram of a node control circuit according to one embodiment.

FIG. 1A is a schematic diagram of a node control circuit 10 according to one embodiment. The node control circuit 10 includes a setting circuit 1 and a follower clamp 2. As shown in FIG. 1A, the setting circuit 1 and the follower clamp 2 are each electrically connected to a circuit node (NODE). Although one embodiment of node control circuit is shown in FIG. 1A, the teachings herein are applicable to node control circuits implemented in a wide variety of ways.

As shown in FIG. 1A, the setting circuit 1 receives a set signal (SET), and the follower clamp 2 receives a clamping control signal (LIMIT). The set signal operates to set a voltage level of the node, while the clamping control signal operates to control an upper or lower limit to the voltage range over which the node is operable.

In certain implementations, the follower clamp 2 is a p-type follower clamp, and the clamping control signal is used to control an upper limit of the voltage range of the node. For example, when the voltage level of the node is greater than or equal to the upper limit, the follower clamp 2 turns on to provide clamping, and otherwise remains turned off. In other implementations, the follower clamp 2 is an n-type follower clamp, and the clamping control signal is used to control a lower limit of the voltage range of the node.

For example, when the voltage level of the node is less than or equal to the lower limit, the follower clamp 2 turns on to provide clamping, and otherwise remains turned off. The follower clamp 2 can be implemented in accordance with any of the embodiments herein.

In certain implementations, the set signal controls the voltage level of the node to change substantially linearly with respect to the set signal. For example, the setting circuit 1 can include a current source that provides a current to a resistor to thereby set the node voltage. In such implementations, the current source and/or the resistor can be controllable by the set signal to provide flexibility in setting the node to a desired voltage.

Although one example implementation of the setting circuit has been described, the setting circuit 1 can be implemented in a wide variety of ways. In another example, the setting circuit 1 is implemented as a digital-to-analog converter (DAC).

Figure 1B:
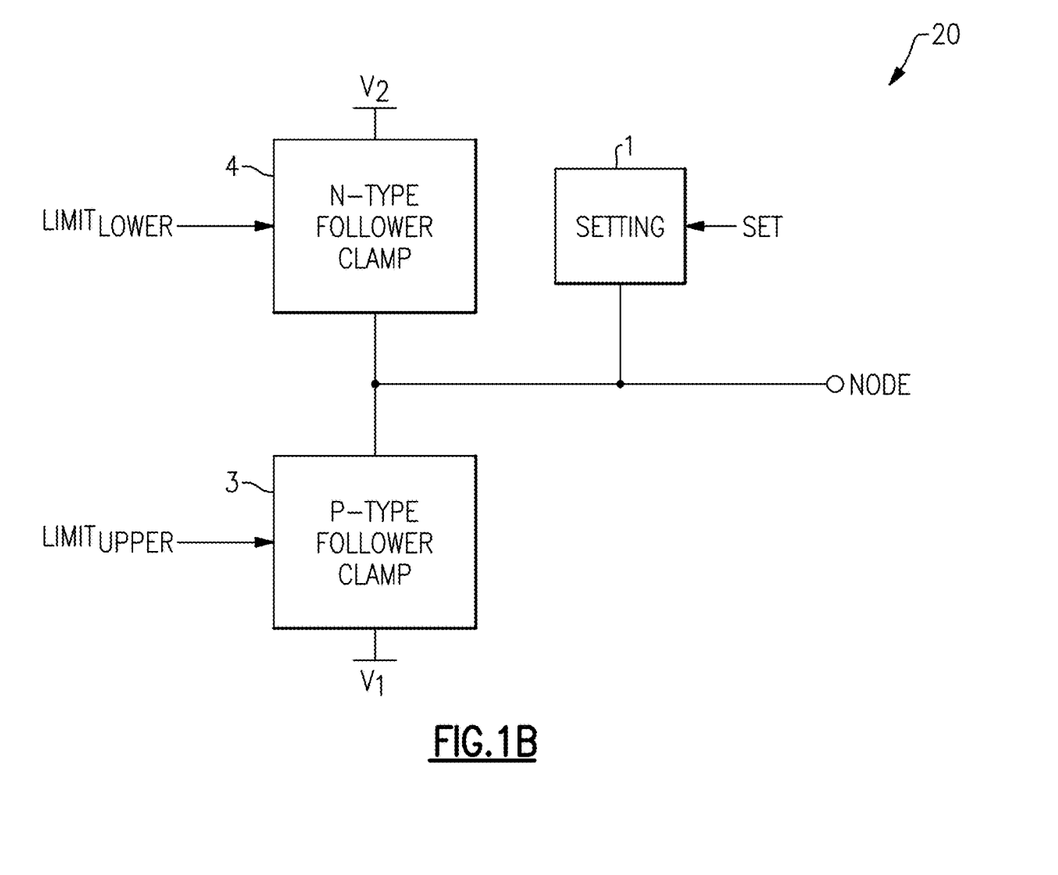
FIG. 1B is a schematic diagram of a node control circuit according to another embodiment.

FIG. 1B is a schematic diagram of a node control circuit 20 according to another embodiment. The node control circuit 20 includes a setting circuit 1, a p-type follower clamp 3, and an n-type follower clamp 4. As shown in FIG. 1B, the setting circuit 1, the p-type follower clamp 3, and the n-type follower clamp 4 are each electrically connected to a node (NODE). Although another embodiment of a node control circuit is shown in FIG. 1B, the teachings herein are applicable to node control circuits implemented in a wide variety of ways.

As shown in FIG. 1B, the setting circuit 1 receives a set signal (SET). Additionally, the p-type follower clamp 3 receives an upper clamping control signal ($LIMIT_{UPPER}$) and the n-type follower clamp 4 receives a lower clamping control signal ($LIMIT_{LOWER}$).

The p-type follower clamp 3 includes one or more p-type followers, such as at least one PFET source follower and/or at least one PNP emitter follower operable to clamp the node to an upper limit controlled by the upper clamping control signal. The p-type follower clamp 3 is inactive when the voltage of the node is less than the upper limit, and activates to clamp the node when the voltage of the node is greater than or equal to the upper limit. Thus, the upper clamping control signal controls an adjustable upper limit at which the p-type follower clamp 3 clamps the node.

The n-type follower clamp 4 includes one or more n-type followers, such as at least one NFET source follower and/or at least one NPN emitter follower operable to clamp the node to a lower limit controlled by the lower clamping control signal. The n-type follower clamp 4 is inactive when the node voltage is greater than the lower limit, and activates to clamp the node when the node voltage is less than or equal to the lower limit. Thus, the lower clamping control signal controls an adjustable lower limit at which the n-type follower clamp 4 clamps the node.

In the illustrated embodiment, the p-type follower clamp 3 is connected between the node and a first voltage ($V_1$), and the n-type follower clamp 4 is connected between the node and a second voltage ($V_2$). When the node control circuit 20 is powered, the second voltage is greater than the first voltage. The first voltage and the second voltage can be any suitable voltages. In one example, the first voltage is a power low supply or ground, and the second voltage is a power high supply. However, other implementations are possible.

As shown in FIG. 1B, the setting circuit 1 receives the set signal, which controls the voltage level of the node. In certain implementations, the set signal controls the voltage level of the node to change substantially linearly with respect to the set signal. Thus, the set signal can be used to set the node voltage to a desired voltage level within a voltage range between the lower limit controlled by the lower clamping control signal and the upper limit by the upper clamping control signal.

Although not depicted in FIG. 1B, in certain implementations a control circuit (for instance, the control circuit 305 of FIG. 9) generates the set signal, the lower clamping control signal, and/or the upper clamping control signal. For example, the control circuit can control the set signal, the lower clamping control signal, and/or the upper clamping control signal based on data received over an interface and/or data stored in a memory.

Figure 2A:
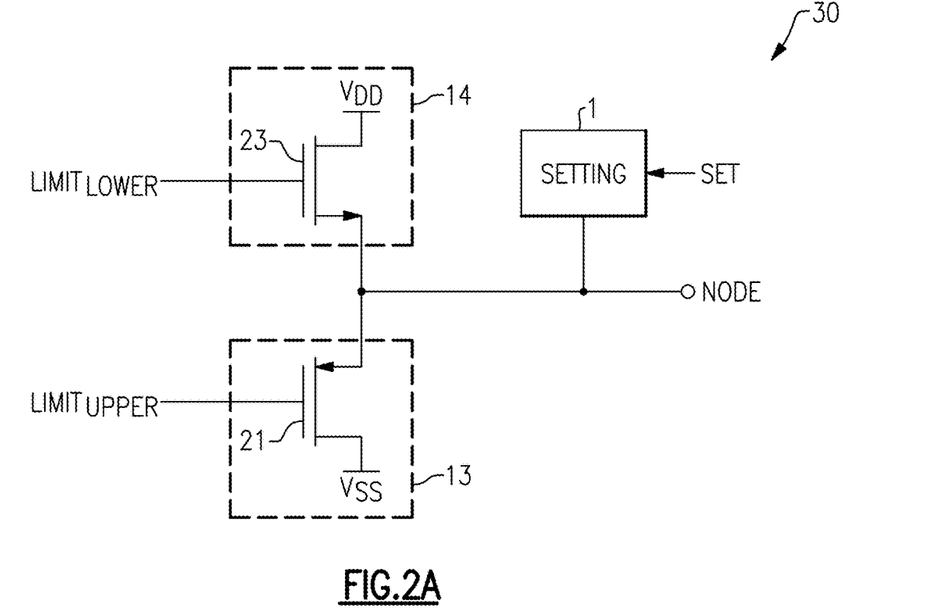
FIG. 2A is a schematic diagram of a node control circuit according to another embodiment.

FIG. 2A is a schematic diagram of a node control circuit 30 according to another embodiment. The node control circuit 30 includes a setting circuit 1, a p-type follower clamp 13, and an n-type follower clamp 14.

The node control circuit 30 of FIG. 2A is similar to the node control circuit 20 of FIG. 1B, except that the node control circuit 30 includes a specific implementation of a p-type follower clamp and of an n-type follower clamp.

For example, the p-type follower clamp 13 of FIG. 2A includes a PFET source follower 21 having a gate that receives the upper clamping control signal ($LIMIT_{UPPER}$), a drain electrically connected to a power low supply voltage ($V_{SS}$), and a source electrically connected to a node (NODE). Additionally, the n-type follower clamp 14 includes an NFET source follower 23 having a gate that receives the lower clamping control signal ($LIMIT_{LOWER}$), a drain electrically connected to a power high supply voltage ($V_{DD}$), and a source electrically connected to the node. In certain implementations, the PFET source follower 21 and/or the NFET source follower 23 is implemented as a MOS transistor, for instance, a DMOS transistor.

Although one embodiment of a p-type follower clamp and of an n-type follower clamp is depicted in FIG. 2A, the teachings herein are applicable to follower clamps implemented in a wide variety of ways.

Figure 2B:
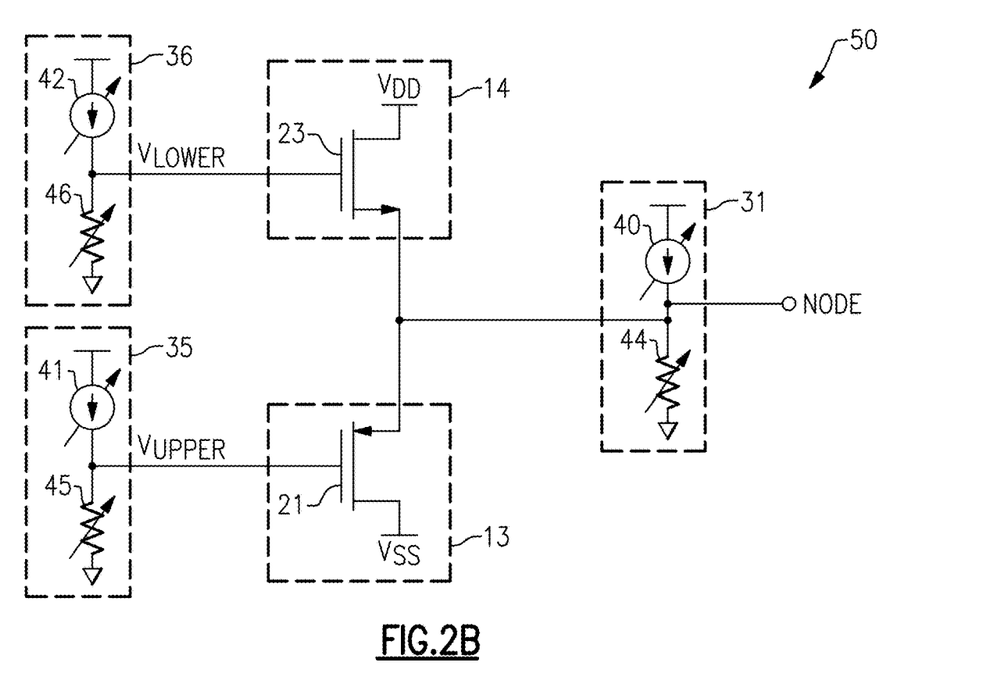
FIG. 2B is a schematic diagram of a node control circuit according to another embodiment.

FIG. 2B is a schematic diagram of a node control circuit 50 according to another embodiment. The node control circuit 50 includes a setting circuit 31, a p-type follower clamp 13, an n-type follower clamp 14, an upper limit control circuit 35, and a lower limit control circuit 36.

The node control circuit 50 of FIG. 2B is similar to the node control circuit 30 of FIG. 2A, except that the node control circuit 50 illustrates one example of circuitry for setting the node voltage and for controlling upper and lower voltage limits of clamping.

For example, the node control circuit 50 includes a setting circuit 31 including a setting current source 40 and a setting resistor 44. At least one of the setting current source 40 or the setting resistor 44 is controllable to adjust the node voltage to a desired voltage level.

In the illustrated embodiment, the upper limit control circuit 35 includes an upper limit current source 41 and an upper limit resistor 45. At least one of the upper limit current source 41 or the upper limit resistor 45 is controllable to adjust an upper clamping control voltage ($V_{UPPER}$). Additionally, the lower limit control circuit 36 includes a lower limit current source 42 and a lower limit resistor 46. At least one of the lower limit current source 42 or the lower limit resistor 46 is controllable to adjust a lower clamping control voltage ($V_{LOWER}$).

Although FIG. 2B depicts one embodiment of circuitry for setting the node voltage and for controlling upper and lower voltage limits of clamping, other implementations are possible.

The node voltage is operable over a voltage range extending from a lower voltage limit to an upper voltage limit. In this embodiment, the upper voltage limit of the voltage range corresponds to about $V_{UPPER}+|V_{THP}|$, where $V_{THP}$ corresponds to the threshold voltage of the PFET source follower 21. The value of $V_{UPPER}$ is based on a product of a current of the upper limit current source 41 and a resistance of the upper limit resistor 45, and thus can be set by controlling the upper limit current source 41 and/or the upper limit resistor 45.

With continuing reference to FIG. 2B, the lower voltage limit corresponds to about $V_{LOWER}-|V_{THN}|$, where $V_{THN}$ corresponds to the threshold voltage of the NFET source follower 23. The value of $V_{LOWER}$ is based on a product of a current of the lower limit current source 42 and a resistance of the lower limit resistor 46, and thus can be set by controlling the lower limit current source 42 and/or the lower limit resistor 46.

When the voltage of the node operates within the voltage range set by the upper voltage limit and the lower voltage limit, both the PFET source follower 21 and the NFET source follower 23 are turned off. Thus, the node voltage can be set by the setting circuit 31 to a desired voltage within the voltage range. However, when the node voltage reaches an upper bound of the voltage range, the PFET source follower 21 turns on to clamp the node voltage to about $V_{UPPER}+|V_{THP}|$. Additionally, when the voltage of the node reaches a lower bound of the voltage range, the NFET source follower 23 turns on to clamp the node voltage to about $V_{LOWER}-|V_{THN}|$.

In this example, the node voltage is set to a particular voltage level within the voltage range by controlling a resistance of the setting resistor 44 and/or a current of the setting current source 40. Although one embodiment of a setting circuit is shown, the teachings herein are applicable to setting circuits implemented in a wide variety of ways.

In certain embodiments, a control circuit (for example, the control circuit 305 of FIG. 9) controls the setting circuit 31, the upper limit control circuit 35, and/or the lower limit control circuit 36. For example, the control circuit can control one or more controllable current sources and/or one or more controllable resistors to achieve desired operating conditions. Such a control circuit can set the voltage levels of the node voltage, the upper clamping control voltage, and/or the lower clamping control voltage based on data received over an interface or bus.

The node control circuit 50 of FIG. 2B can have a maximum operating voltage that is limited by a maximum gate-to-source voltage rating of the PFET source follower 21 and/or the NFET source follower 23. For instance, in one example the transistors have a 5 V gate-source rating and 30 V gate-drain rating, $V_{DD}$ is 15 V, $V_{SS}$ is −15 V, $V_{UPPER}$ is 10V, $V_{LOWER}$ is −10 V, and the voltage of the node is 0 V. In this example, the PFET source follower 21 gets −15 V source-gate voltage and breaks down when the node voltage is −5 V.

In certain embodiments herein, a p-type follower clamp and/or an n-type follower clamp is implemented using a pair of cross-connected follower transistors. Implementing a follower clamp in this manner provides protection to the transistors from overvoltage, thereby expanding a maximum operating voltage of the node control circuit. For instance, in the context of MOS transistors, cross-connecting a pair of MOS transistor followers can limit gate-to-source voltages, thereby protecting the transistors from gate oxide breakdown.

Figure 3A:
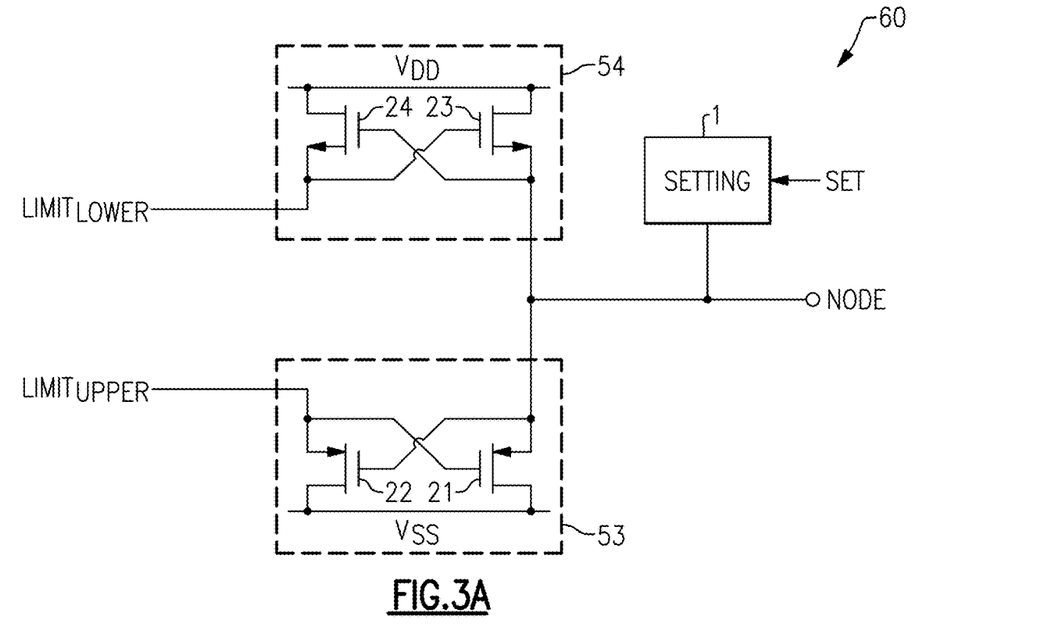
FIG. 3A is a schematic diagram of a node control circuit according to another embodiment.

FIG. 3A is a schematic diagram of a node control circuit 60 according to another embodiment. The node control circuit 60 includes a setting circuit 1, a p-type follower clamp 53, and an n-type follower clamp 54. The node control circuit 60 of FIG. 3A is similar to the node control circuit 30 of FIG. 2A, except that the node control circuit 60 illustrates an implementation in which the p-type follower clamp 53 and the n-type follower clamp 54 have each been implemented with a pair of cross-connected source followers.

For example, the p-type follower clamp 53 includes a first PFET source follower 21 and a second PFET source follower 22, which are cross-coupled. In particular, a source of the first PFET source follower 21 is connected to a gate of the second PFET source follower 22, and a source of the second PFET source follower 22 is connected to a gate of the first PFET source follower 21. Additionally, the n-type follower clamp 54 includes first NFET source follower 23 and a second NFET source follower 24, which are cross-coupled.

By cross-coupling a pair of follower transistors, enhanced protection against overvoltage is provided. For example, cross-connecting a pair of MOS transistor followers can limit gate-to-source voltages, thereby protecting the transistors from gate oxide breakdown or damage.

In certain implementations, the first PFET source follower 21 and the second PFET source follower 22 are implemented using p-type DMOS transistors and/or the first NFET source follower 23 and the second NFET source follower 24 are implemented using n-type DMOS transistors.

Figure 3B:
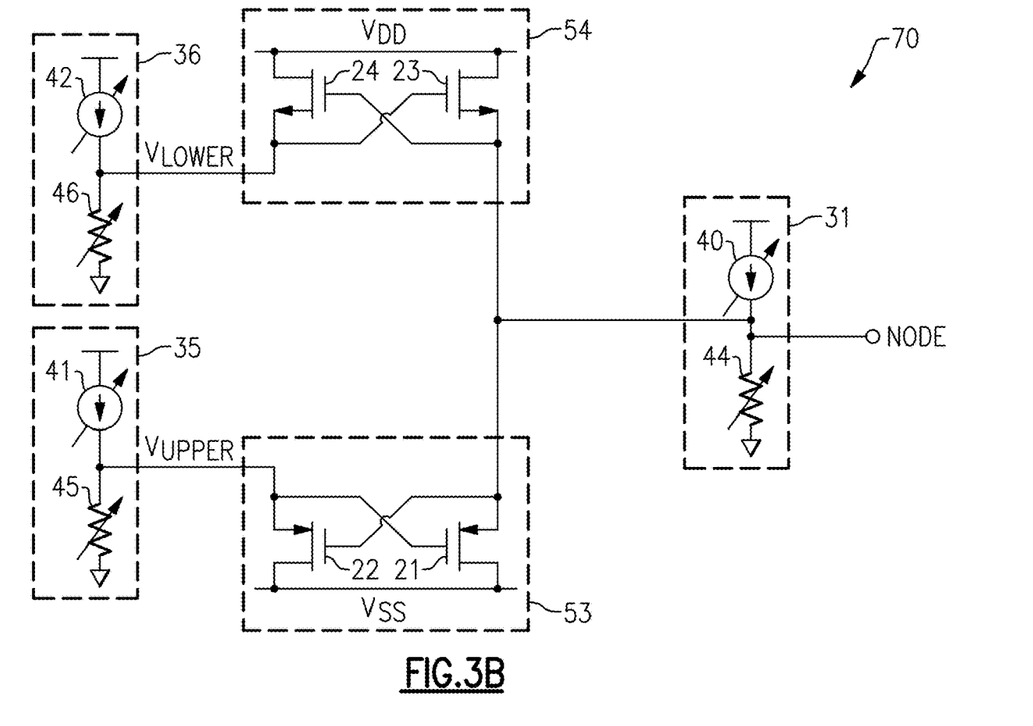
FIG. 3B is a schematic diagram of a node control circuit according to another embodiment.

FIG. 3B is a schematic diagram of a node control circuit 70 according to another embodiment. The node control circuit 70 of FIG. 3B is similar to the node control circuit 60 of FIG. 3A, except that the node control circuit 70 further includes the setting circuit 31, the upper limit control circuit 35, and the lower limit control circuit 36, which were described above with respect to FIG. 2B.

Figure 4A:
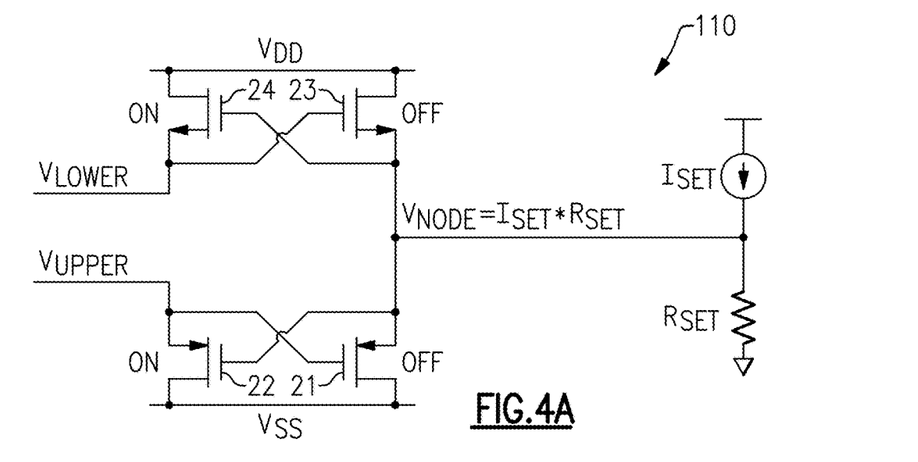
FIG. 4A is a schematic diagram illustrating a first example operating scenario of the node control circuit of FIG. 3B.
Figure 4B:
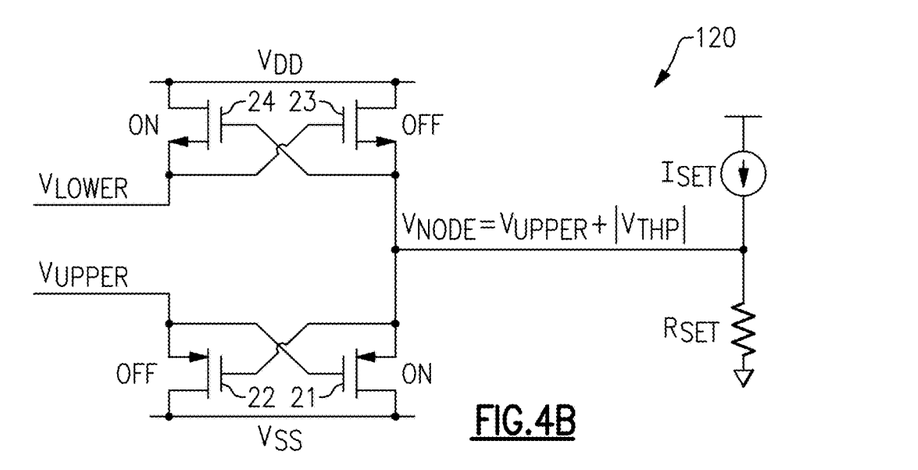
FIG. 4B is a schematic diagram illustrating a second example operating scenario of the node control circuit of FIG. 3B.
Figure 4C:
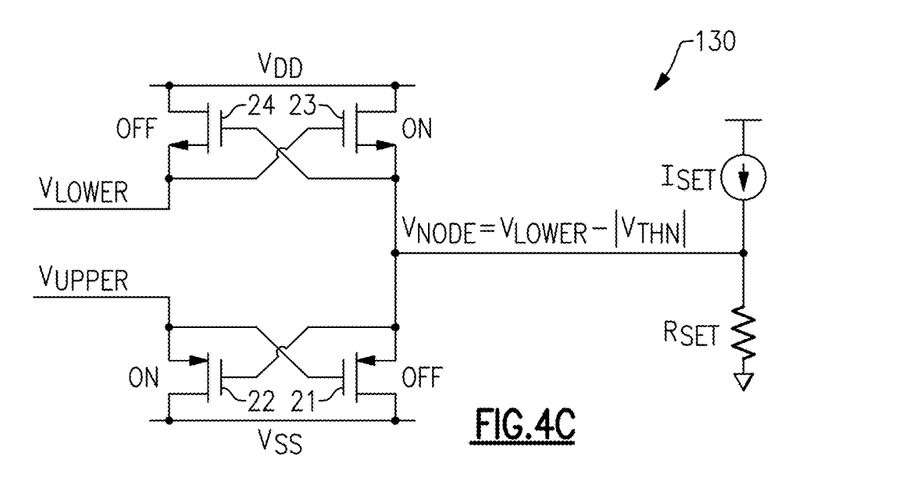
FIG. 4C is a schematic diagram illustrating a third example operating scenario of the node control circuit of FIG. 3B.

Various operating scenarios of the node control circuit 70 of FIG. 3B are depicted in FIGS. 4A-4C. For clarity of the figures, the upper limit control circuit 35 and the lower limit control circuit 36 of FIG. 3B are not depicted in FIGS. 4A-4C. Additionally, in this example, the setting current source 40 of FIG. 3B operates with a current $I_{SET}$ and the setting resistor 44 of FIG. 3B operates with a resistance $R_{SET}$.

FIG. 4A is a schematic diagram illustrating a first example operating scenario 110 of the node control circuit 70 of FIG. 3B. The first example operating scenario 110 corresponds to an example in which the node voltage ($V_{NODE}$) is above the lower limit of clamping set by $V_{LOWER}$ and also below the upper limit of clamping set by $V_{UPPER}$. In this example, $V_{NODE}$ corresponds to $I_{SET}*R_{SET}$.

As shown in FIG. 4A, the first PFET source follower 21 and the first NFET source follower 23 are turned off in this operating scenario. Additionally, the second PFET source follower 22 is turned on to limit the gate-to-source voltage of the first PFET source follower 21. Furthermore, the second NFET source follower 24 is turned on to limit the gate-to-source voltage of the first NFET source follower 23.

FIG. 4B is a schematic diagram illustrating a second example operating scenario 120 of the node control circuit 70 of FIG. 3B. The second example operating scenario 120 corresponds to an example in which $V_{NODE}$ reaches the upper limit of clamping set by $V_{UPPER}$. In this example, $V_{NODE}$ corresponds to $V_{UPPER}+|V_{THP}|$, where $V_{THP}$ is the threshold voltage of the first PFET source follower 21.

As shown in FIG. 4B, the first PFET source follower 21 and the second NFET source follower 24 are turned on, while the second PFET source follower 22 and the first NFET source follower 23 are turned off.

FIG. 4C is a schematic diagram illustrating a third example operating scenario 130 of the node control circuit 70 of FIG. 3B. The third example operating scenario 130 corresponds to an example in which $V_{NODE}$ reaches the lower limit of clamping set by $V_{LOWER}$. In this example, $V_{NODE}$ corresponds to $V_{LOWER}-|V_{THN}|$, where $V_{THN}$ is the threshold voltage of the first NFET source follower 23.

As shown in FIG. 4C, the first PFET source follower 21 and the second NFET source follower 24 are turned off, while the second PFET source follower 22 and the first NFET source follower 23 are turned on.

In certain embodiments herein, an error amplifier is included in a p-type follower clamp and/or an n-type follower clamp to enhance a precision of an upper and/or lower limit of clamping. For example, in the context of an implementation using MOS transistors, including the error amplifiers compensates the lower voltage limit and the upper voltage limit for an offset corresponding to the threshold voltage of the MOS transistors. Additionally, in the context of an implementation using bipolar transistors, including the error amplifiers compensates the lower voltage limit and the upper voltage limit for an offset arising from the base-to-emitter voltage of the bipolar transistors.

Figure 5:
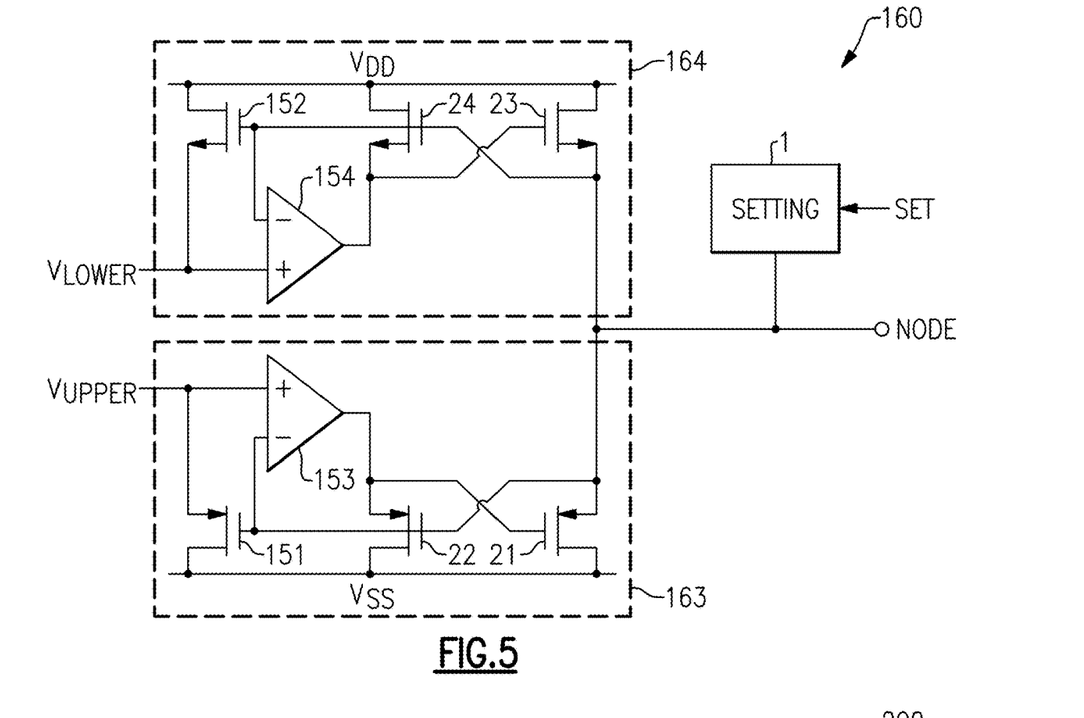
FIG. 5 is a schematic diagram of a node control circuit according to another embodiment.

FIG. 5 is a schematic diagram of a node control circuit 160 according to another embodiment. The node control circuit 160 includes a setting circuit 1, a p-type follower clamp 163, and an n-type follower clamp 164. Although another embodiment of a node control circuit is shown in FIG. 5, the teachings herein are applicable to node control circuits implemented in a wide variety of ways.

The p-type follower clamp 163 of FIG. 5 is similar to the p-type follower clamp 53 of FIG. 3A, except that the p-type follower clamp 163 further includes a clamping PFET transistor 151 and a first error amplifier 153. Additionally, the n-type follower clamp 164 of FIG. 5 is similar to the n-type follower clamp 54 of FIG. 3A, except that the n-type follower clamp 164 further includes a clamping NFET transistor 152 and a second error amplifier 154. In certain implementations, the first error amplifier 153 and the second error amplifier 154 are implemented as transconductance amplifiers.

The first error amplifier 153 controls a gate voltage of the first PFET source follower 21 such that a voltage difference between the non-inverting input and inverting input of the first error amplifier 153 is about equal to 0 V. Additionally, the second error amplifier 154 controls a gate voltage of the first NFET source follower 23 such that a voltage difference between the non-inverting input and inverting input of the second error amplifier 154 is about equal to 0 V.

The feedback provided by the first error amplifier 153 and the second error amplifier 154 compensates for the threshold voltages of the PFET source follower 21 and the NFET source follower 23, respectively. Thus, the lower bound and upper bound of the voltage range correspond to $V_{LOWER}$ and $V_{UPPER}$, respectively. In contrast, the node control circuit 70 of FIG. 3B provided an upper voltage limit of about $V_{UPPER}+|V_{THP}|$ and a lower voltage limit of about $V_{LOWER}-|V_{THN}|$.

By including the error amplifiers, the upper and lower voltage limits are compensated for an offset corresponding to the threshold voltage. In certain applications, threshold voltage offset is undesirable, since such offset can lead to an uncertainty in the available operating voltage range of the node. For example, a transistor's threshold voltage can vary with temperature, process and/or aging.

The p-type follower clamp 163 of FIG. 5 also includes the clamp PFET 151, which operates to clamp the differential input to the first error amplifier 153 to a voltage difference of about $|V_{THP}|$. Additionally, the n-type follower clamp 164 of FIG. 5 also includes the clamp NFET 152, which operates to clamp the differential input to the second error amplifier 154 to a voltage difference of about $|V_{THN}|$. Including the clamp PFET 151 and the clamp NFET 152 provides a number of advantages, including, but not limited to, protecting an input differential transistor pair of each error amplifier from overvoltage.

Although FIGS. 2A-5 have been illustrated in the context of FETs, any of the follower clamps herein can be implemented using bipolar transistors or a combination of FETs and bipolar transistors. Moreover, although certain embodiments herein are depicted as including both a p-type follower clamp and an n-type follower clamp, any of the embodiments disclosed herein can be modified to include the p-type follower clamp but not the n-type follower clamp, or to include the n-type follower clamp but not the p-type follower clamp.

Figure 6:
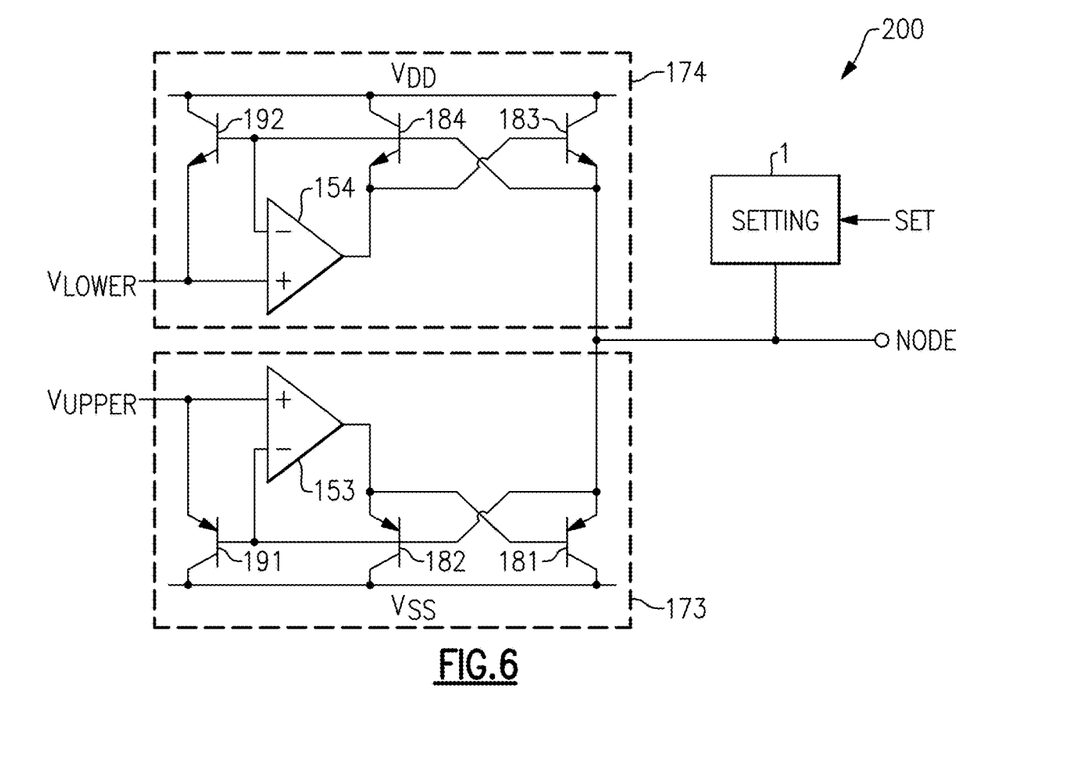
FIG. 6 is a schematic diagram of a node control circuit according to another embodiment.

FIG. 6 is a schematic diagram of a node control circuit 200 according to another embodiment. The node control circuit 200 includes a setting circuit 1, a p-type follower circuit 173, and an n-type follower circuit 174. The node control circuit 200 of FIG. 6 is similar to the node control circuit 160 of FIG. 5, except that the node control circuit 200 is implemented using bipolar transistors rather than FETs.

For example, the p-type follower circuit 173 includes a first PNP emitter follower 181 and a second PNP emitter follower 182, which are cross-connected. Additionally, p-type follower circuit 173 further includes a first error amplifier 153 and a clamp PNP transistor 191. The n-type follower circuit 174 further includes a first NPN emitter follower 183 and a second NPN emitter follower 184, which are cross-connected. Additionally, the n-type follower circuit 174 further includes a second error amplifier 154 and a clamp NPN transistor 192.

With continuing reference to FIG. 6, the first error amplifier 153 operates to compensate an upper limit provided by the p-type follower circuit 173 for the $V_{BE}$ of the first PNP emitter follower 181. Additionally, the second error amplifier 154 operates to compensate a lower limit provided by the n-type follower circuit 174 for the $V_{BE}$ of the first NPN emitter follower 183. Additional details of the node control circuit 200 of FIG. 6 are similar to those described above.

Figure 7A:
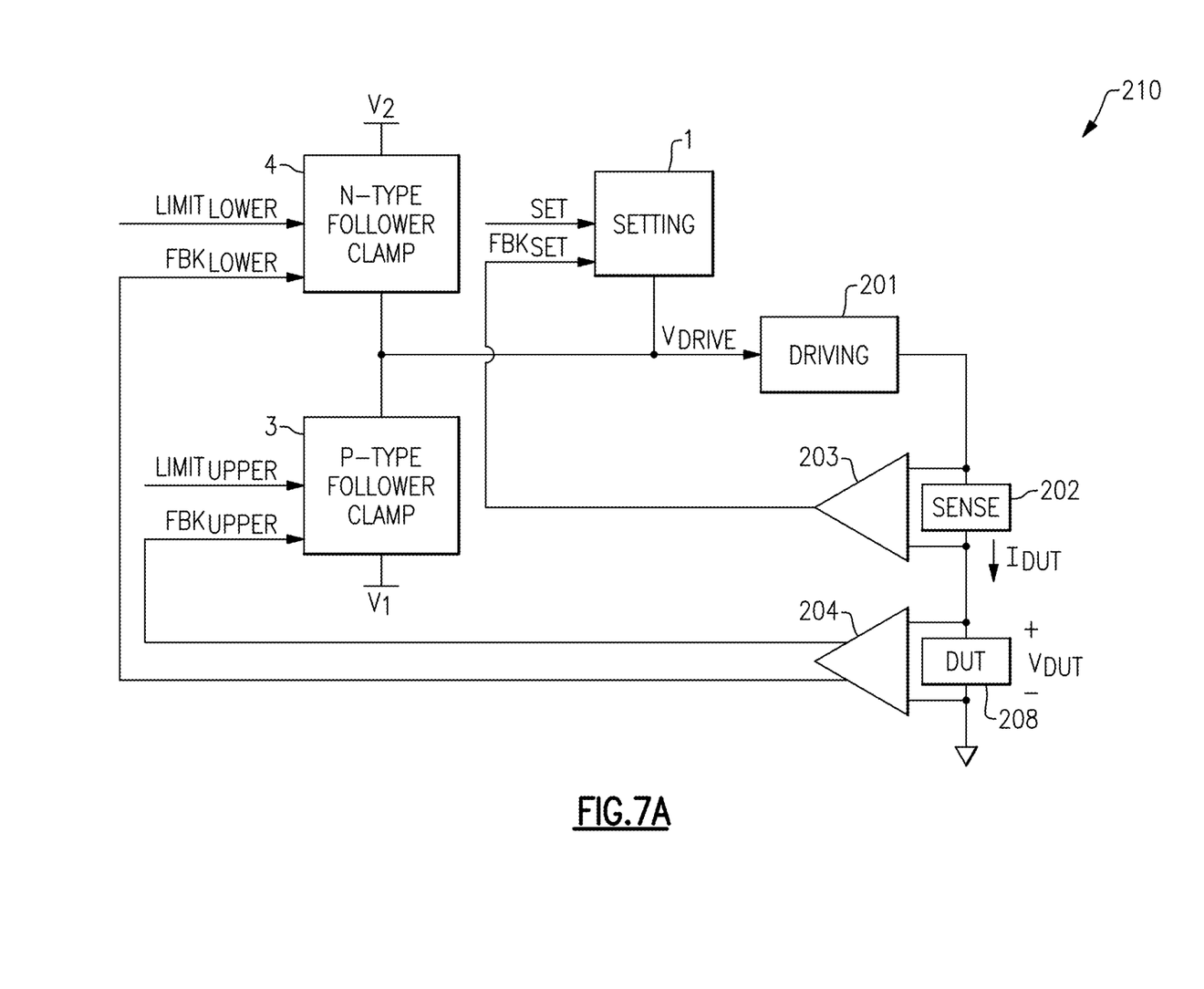
FIG. 7A is a schematic diagram of one embodiment of a node control system connected with feedback.

FIG. 7A is a schematic diagram of one embodiment of a node control system 210 connected with feedback. Although one embodiment of feedback loops for a node control circuit are shown, the teachings herein are applicable to a wide range of node control circuits operating closed loop. Moreover, the node control circuits herein can also be operated open loop without feedback.

The node control system 210 of FIG. 7A includes a setting circuit 1, a p-type follower clamp 3, an n-type follower clamp 4, a driving circuit 201, a sensing circuit 202, a first feedback amplifier 203, and a second feedback amplifier 204. The node control system 210 operates to drive a device under test (DUT) 208, which in certain implementations is a sensor.

The setting circuit 1, the p-type follower clamp 3, and the n-type follower clamp 4 operate to control a driving voltage ($V_{DRIVE}$) of a node. As shown in FIG. 7A, the setting circuit 1 receives a set signal (SET), the p-type follower clamp 3 receives an upper clamping control signal ($LIMIT_{UPPER}$), and the n-type follower clamp 4 receives a lower clamping control signal (LIMIT$_{LOWER}$). The setting circuit 1, the p-type follower clamp 3, and the n-type follower clamp 4 can be implemented in accordance with any of the embodiments herein.

With continuing reference to FIG. 7A, the driving circuit 201 includes an input that receives the driving voltage, and an output electrically connected to the DUT 208 through the sensing circuit 202. The DUT 208 operates with a current I$_{DUT}$ through the DUT 208 and a voltage V$_{DUT}$ across the DUT 208, in this embodiment. The sensing circuit 202 converts the current I$_{DUT}$ to a corresponding voltage across the sensing circuit 202.

In the illustrated embodiment, the first feedback amplifier 203 amplifies the voltage across the sensing circuit 202 to generate a set feedback signal (FBK$_{SET}$), which provides feedback to the setting circuit 1 to thereby adjust the voltage level of the driving voltage. Implementing the feedback loop of the setting circuit 1 in this manner controls the driving voltage such that the current I$_{DUT}$ through the DUT 208 is of a particular controlled current level.

With continuing reference to FIG. 7A, the second feedback amplifier 204 amplifies a voltage V$_{DUT}$ across the DUT 208 to generate an upper clamp feedback signal (FBK$_{UPPER}$) for the p-type follower clamp 3 and a lower clamp feedback signal (FBK$_{LOWER}$) for the n-type follower clamp 4.

Providing feedback to the p-type follower clamp 3 and the n-type follower clamp 4 in this manner protects the DUT 208 from damage from excessively large overvoltage or undervoltage conditions.

For example, certain types of DUTs (for instance, certain types of sensors) can have a limitation on a maximum operating bias voltage that the DUT can operate without damage. Although it can be desirable in certain applications to provide feedback to the setting circuit 1 to achieve a particular current I$_{DUT}$ through the DUT 208 for purposes of measurement (for instance, sensor impedance measurement), forcing a current of a particular value through DUT 208 can result in the DUT 208 being biased with a large voltage.

The feedback to the p-type follower clamp 3 and to the n-type follower clamp 4 provides dynamic adjustment to the upper limit and lower limit of the voltage range of the driving voltage, thereby protecting the DUT 208 from damage.

In the illustrated embodiment, the bandwidths of the control loops of the setting circuit 1, the p-type follower clamp 3, and/or the n-type follower clamp 4 can be separately set. Independent control of loop bandwidth can provide enhanced flexibility for providing measurement of DUTs of a wide range of impedance values.

Although an embodiment with both the p-type follower clamp 3 and the n-type follower clamp 4 is depicted, in certain implementations one of the p-type follower clamp 3 or the n-type follower clamp 4 is omitted.

Figure 7B:
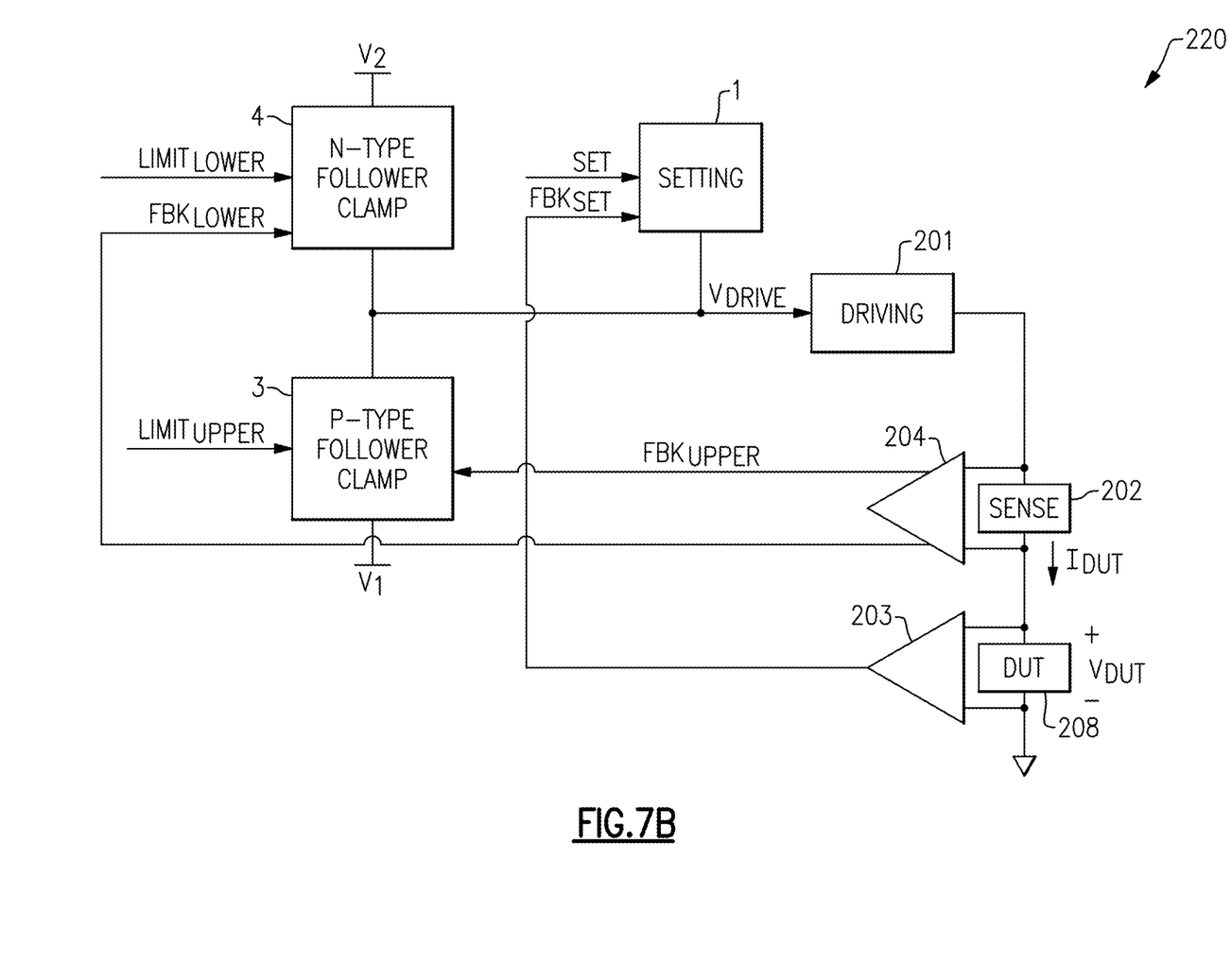
FIG. 7B is a schematic diagram of another embodiment of a node control system connected with feedback.

FIG. 7B is a schematic diagram of another embodiment of a node control system 220 connected with feedback.

The node control system 220 of FIG. 7B is similar to the node control system 210 of FIG. 7A, except that the node control system 220 of FIG. 7B uses the first feedback amplifier 203 to generate the set feedback signal (FBK$_{SET}$) based on amplifying the voltage V$_{DUT}$ across the DUT 208. Additionally, the node control system 220 of FIG. 7B uses the second feedback amplifier 204 to generate the upper clamp feedback signal (FBK$_{UPPER}$) and the lower clamp feedback signal (FBK$_{LOWER}$) based on amplifying the voltage difference across the sensing circuit 202.

By implementing the node control system 220 in this manner, the first feedback amplifier 203 provides feedback to the setting circuit 1 to achieve a particular voltage V$_{DUT}$ across the DUT 208.

Although it can be desirable in certain applications to provide feedback to the setting circuit 1 to achieve a particular voltage V$_{DUT}$ across the DUT 208 for purposes of measurement (for instance, sensor impedance measurement), forcing a voltage of a particular value across the DUT 208 can result in the DUT 208 sinking or sourcing a large current.

The feedback to the p-type follower clamp 3 and to the n-type follower clamp 4 from the second feedback amplifier 204 provides dynamic adjustment to the upper limit and lower limit of the voltage range of the driving voltage, thereby protecting the DUT 208 from damage from excessive current.

Figure 8A:
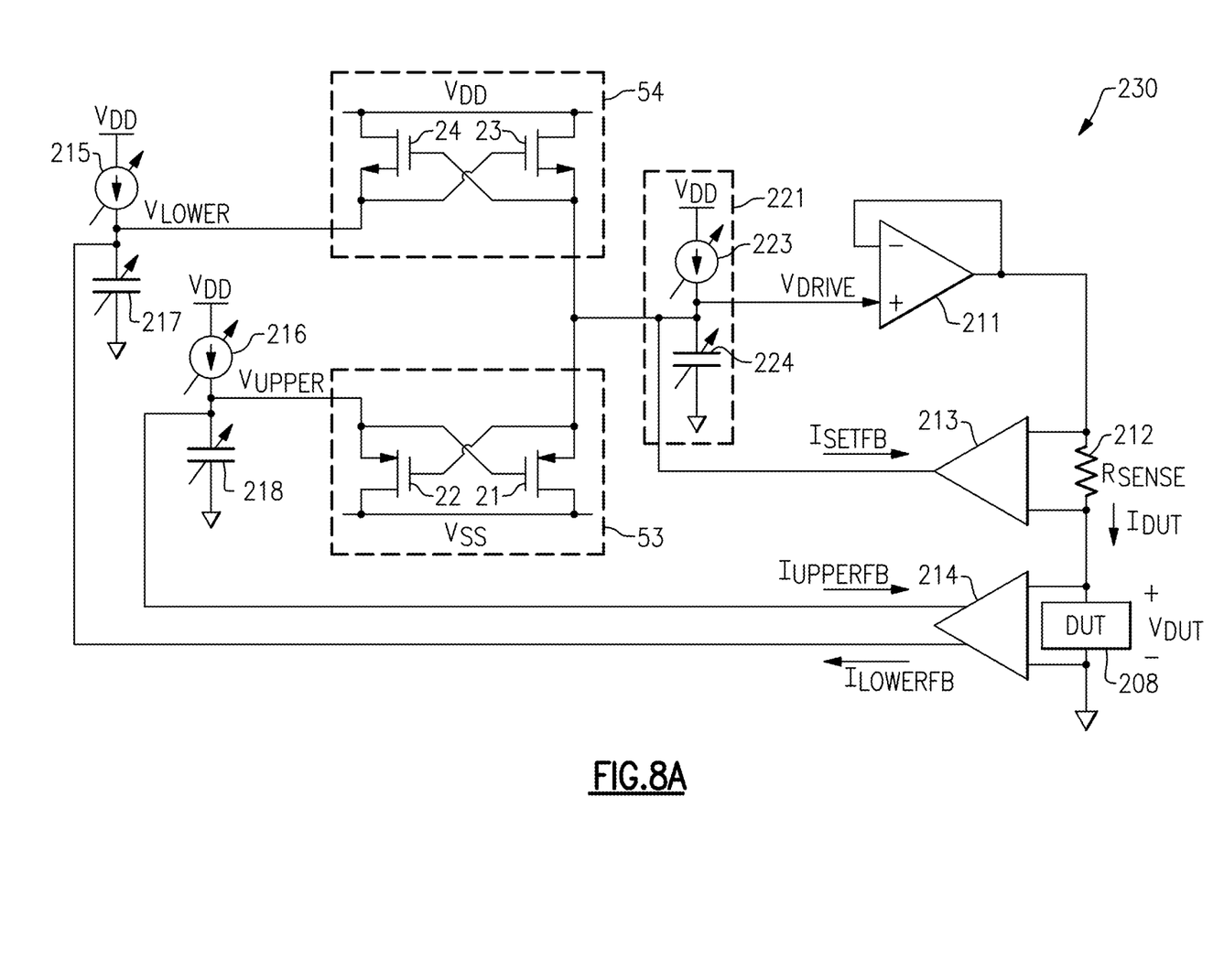
FIG. 8A is a schematic diagram of another embodiment of a node control system connected with feedback.

FIG. 8A is a schematic diagram of another embodiment of a node control system 230 connected with feedback. The node control system 230 includes a setting circuit 221, a p-type follower clamp 53, an n-type follower clamp 54, a unity-gain buffer 211, a sense resistor 212, a first feedback instrumentation amplifier 213, a second feedback instrumentation amplifier 214, a lower limit current source 215, a lower limit capacitor 217, an upper limit current source 216, and an upper limit capacitor 218. The node control system 210 operates to drive a DUT 208.

In the illustrated embodiment, the node control system 230 includes the p-type follower clamp 53 and the n-type follower clamp 54 of the embodiment of FIG. 3B. However, the node control system 230 can be modified to operate with any of the p-type follower clamps and/or n-type follower clamps described herein.

As shown in FIG. 8A, the n-type follower clamp 54 receives a lower clamping control voltage (V$_{LOWER}$), and the p-type follower clamp 53 receives an upper clamping control voltage (V$_{UPPER}$). In certain implementations, at least one of the lower limit current source 215 or the lower limit capacitor 217 is controllable to adjust the lower clamping control voltage and/or at least one of the upper limit current source 216 or the upper limit capacitor 218 is controllable to adjust the upper clamping control voltage. For example, a control circuit (for instance, the control circuit 305 of FIG. 9) can provide such adjustment or control to the illustrated components.

With continuing reference to FIG. 8A, the setting circuit 221 includes a setting current source 223 and a setting capacitor 224 operable to control the driving voltage (V$_{DRIVE}$). In certain implementations, at least one of the setting current source 223 or the setting capacitor 224 is controllable to adjust the driving voltage. For example, a control circuit (for instance, the control circuit 305 of FIG. 9) can provide such control to the setting circuit 221.

In the illustrated embodiment, the unity-gain buffer 211 includes a non-inverting input that receives the driving voltage. The unity-gain buffer 211 also includes an output connected to an inverting input to provide negative feedback. In this example, the output of the unity-gain buffer 211 is connected to the DUT 208 through the sense resistor 212, which has a resistance R$_{SENSE}$. Although an example with a DUT 208 driven by the unity-gain buffer 211 through the sense resistor 212 is shown, other implementations are possible, including, but not limited to, implementations using a resistive transimpedance amplifier and/or a capacitive transimpedance amplifier.

With continuing reference to FIG. 8A, the first feedback instrumentation amplifier 213 amplifies a voltage across the sense resistor 212 to generate a set feedback current ($I_{SETFB}$) that is provided to the setting circuit 221. Additionally, the second feedback instrumentation amplifier 214 amplifies a voltage $V_{DUT}$ across the DUT 208 to generate an upper clamp feedback current ($I_{UPPERFB}$) for adjusting the upper clamping control voltage ($V_{UPPER}$) and a lower clamp feedback current ($I_{LOWERFB}$) for adjusting the lower clamping control voltage ($V_{LOWER}$).

In the illustrated embodiment, the first feedback instrumentation amplifier 213 provides feedback to the setting circuit 221 to thereby control the current $I_{DUT}$ to a desired value, while the second feedback instrumentation amplifier 214 provides feedback to the p-type follower clamp 53 and the n-type follower clamp 54 to limit the voltage range of the driving voltage to thereby protect the DUT 208 from excessive voltage.

Thus, the feedback used in the node control system 230 of FIG. 8A is similar to that of the node control system 210 of FIG. 7A. In another embodiment, the feedback provided by the first feedback instrumentation amplifier 213 and the second feedback instrumentation amplifier 214 is reversed such that feedback is similar to that of the node control system 220 of FIG. 7B. For example, the first instrumentation amplifier 213 can be implemented to amplify the voltage $V_{DUT}$ across the DUT 208 rather than the voltage across the sense resistor 212, while the second instrumentation amplifier 214 can be implemented to amplify the voltage across the sense resistor 212 rather than the voltage $V_{DUT}$ across the DUT 208.

Figure 8B:
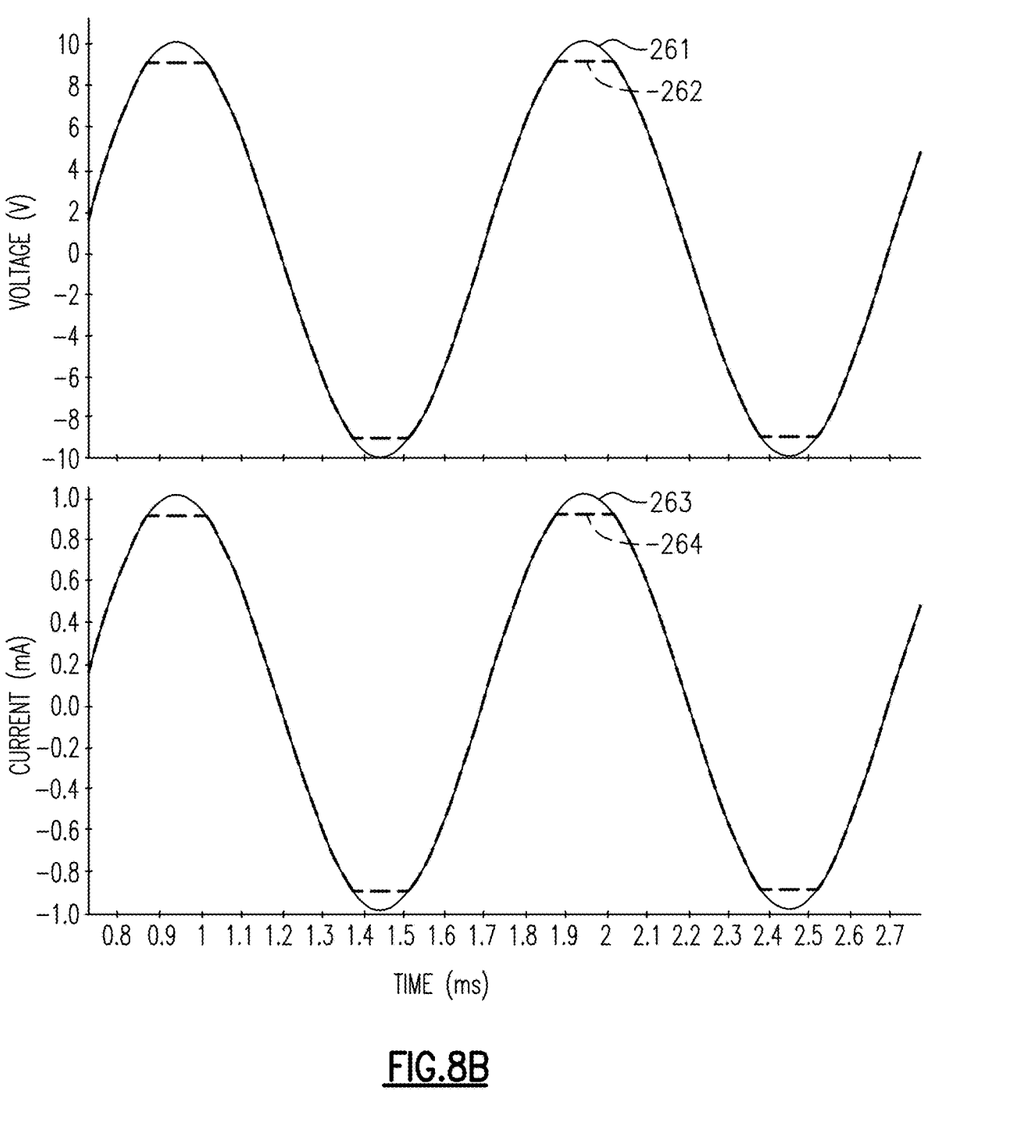
FIG. 8B is a graph of example of simulation results for the node control system of FIG. 8A.

FIG. 8B is a graph of example of simulation results for the node control system 230 of FIG. 8A.

The graph includes an upper portion including a plot 261 of scaled current of the set current source 223 versus time and a plot 262 of the voltage $V_{DUT}$ across the DUT 208 versus time. As shown in the upper portion of the graph, the voltage $V_{DUT}$ across the DUT 208 is clamped to about +/−9 V, in this example.

With continuing reference to FIG. 8B, the graph further includes a lower portion including a plot 263 of scaled current of the set current source 223 versus time and a plot 264 of the current $I_{DUT}$ through the DUT 208 versus time. As shown in the lower portion of the graph, the current $I_{DUT}$ through the DUT 208 is clamped to about +/−9 mA, in this example.

Although various examples of performance results have been shown, simulation or measurement results can vary based on a wide variety of factors, such as simulation models, simulation tools, simulation parameters, measurement conditions, fabrication technology, and/or implementation details. Accordingly, other results are possible.

Figure 9:
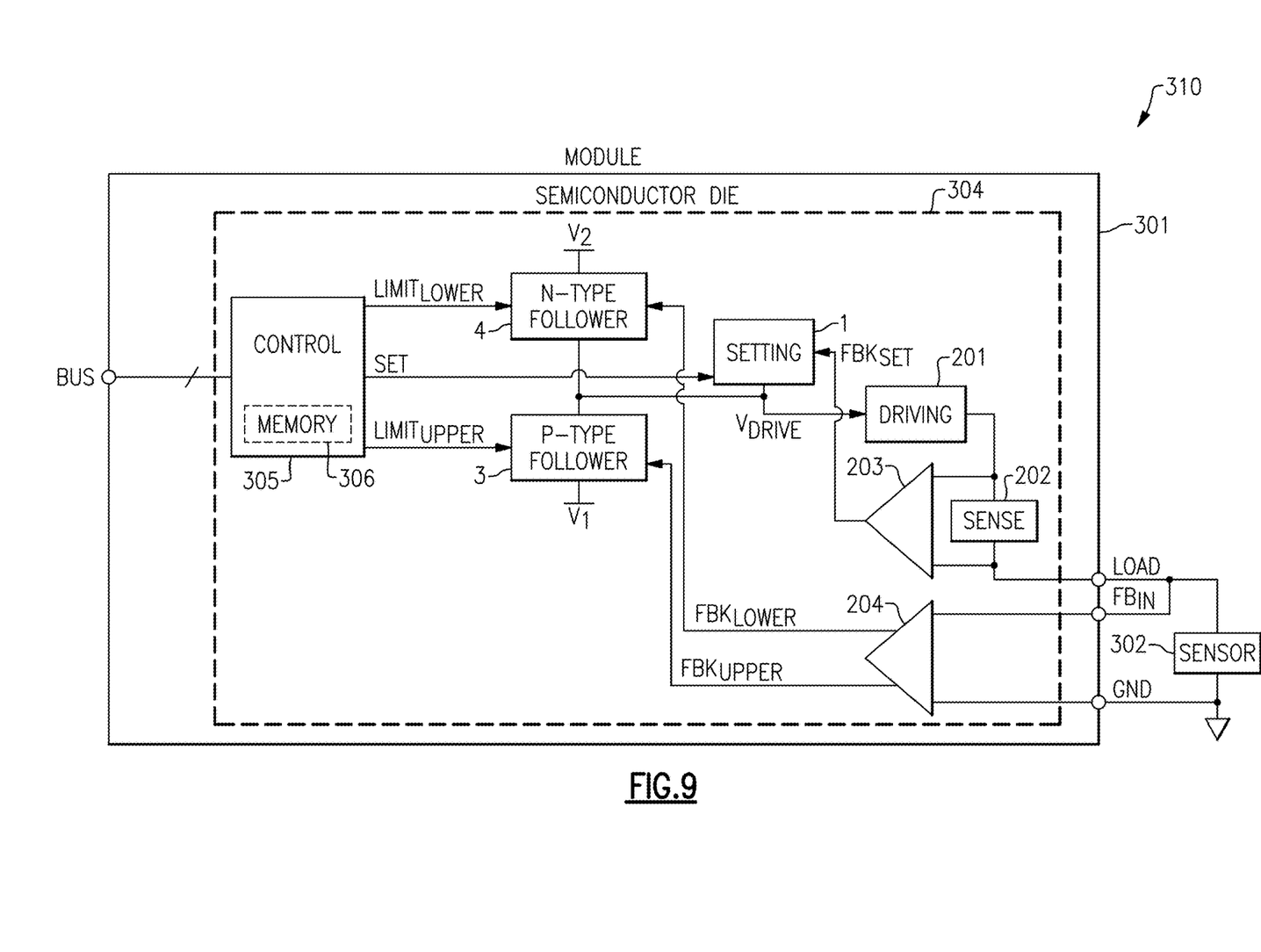
FIG. 9 is a schematic diagram of a module according to one embodiment.

FIG. 9 is a schematic diagram of a module 310 according to one embodiment. The module 310 includes a semiconductor chip 304 attached to a module substrate 301. A chip is also referred to herein as a semiconductor die or integrated circuit (IC). Although depicted schematically, the module 310 can also include adhesives, solder, encapsulation, surface mount components, additional pins or pads, additional dies, and/or a wide variety of other structures that have been omitted for clarity of the figure.

The module 310 illustrates one example of an electronic module implemented in accordance with the teachings herein. In the illustrated embodiment, the semiconductor chip 304 includes a setting circuit 1, a p-type follower circuit 3, an n-type follower circuit 4, a driving circuit 201, a sensing circuit 202, a first feedback amplifier 203, a second feedback amplifier 204, and a control circuit 305 fabricated thereon. Although particular circuitry is shown, other implementations are possible, such as implementations in which one or more of the illustrated circuits is omitted and/or in which additional circuitry is included.

The semiconductor chip 304 can be implemented in accordance with any of the embodiments herein. For example, the p-type follower circuit 3 and/or the n-type follower circuit 4 can be implemented in accordance with any of the clamps of FIGS. 2A-6. Likewise, setting circuitry, feedback circuitry, driving circuitry, and/or other aspects of the semiconductor chip 304 can be implemented in accordance with any of the embodiments herein.

In the illustrated embodiment, the module 310 includes an interface or bus (BUS) that is coupled through pins of the semiconductor die 304 to the control circuit 305. The bus can be used to program digital data to the semiconductor chip 304 to achieve a desired configuration of the module 310 for a given sensor 302. In the illustrated embodiment, the bus can be used to control one or more of the set signal (SET) provided to the setting circuit 1, the upper clamping control signal ($LIMIT_{UPPER}$) provided to the p-type follower clamp 3, or the lower clamping control signal ($LIMIT_{LOWER}$) provided to the n-type follower clamp 4.

The control circuit 305 of FIG. 9 includes a memory circuit 306, which includes digital data indicating a particular configuration of the semiconductor chip 304. Additionally, the memory circuit 306 receives digital data from the bus.

In certain implementations, the memory circuit 306 includes a volatile memory that is programmed with the desired configuration of the semiconductor chip 304 using the bus after power-up. For instance, a user of the module 310 can program the memory circuit 306 with data indicating the desired configuration of the semiconductor chip 304. However, other configurations are possible, such as implementations in which the memory circuit 306 includes a non-volatile memory (for instance, a flash memory, a read-only memory (ROM), fuses, anti-fuses, and/or a magnetic storage device) programmed with the configuration data. In such implementations, the memory circuit 306 can be programmed after manufacture with data associated with a particular target application or DUT.

As shown in FIG. 9, the load pin (LOAD) of the module 310 couples to a first terminal of the sensor 302 and to a load pin of the semiconductor die 304. In this example, the feedback input pin ($FB_{IN}$) of the module 310 also couples to the first terminal of the sensor 302 and to a feedback input pin of the semiconductor die 304. However, other implementations are possible, such as implementations using different configurations of feedback. Including a load pin and a separate feedback input pin enhances the flexibility of the module 310. In this example, the module 310 also includes a ground pin (GND) coupled to a second terminal of the sensor 302 and to a ground pin of the semiconductor die 304. Thus, a voltage across the sensor 302 is provided to the second feedback amplifier 204, in this embodiment.

In the illustrated embodiment, the semiconductor chip 304 is implemented with feedback loops in accordance with the node control system 210 of FIG. 7A. However, other implementations are possible. For example, in another embodiment, a semiconductor chip is implemented with feedback loops in accordance with the node control system 220 of FIG. 7B.

The module 310 of FIG. 9 is suitable for deployment in a wide range of applications. For example, the module 310 can operate in combination with a wide variety of types of sensors, including sensors with varying impedances and/or desired biasing conditions. Although one example of a module is shown, the teachings herein are applicable to a wide variety of types of electronic systems and modules. Accordingly, other implementations are possible.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A node control circuit with controllable voltage operating range and set voltage, the node control circuit comprising:
   a setting circuit electrically connected to a node and operable to control a voltage of the node within a voltage range, wherein the setting circuit is configured to set the voltage of the node based on a set signal; and
   at least one clamping circuit configured to control the voltage range, the at least one clamping circuit comprising a follower transistor clamp configured to receive a clamping control signal operable to adjust a voltage limit at which the follower transistor clamp activates to clamp the voltage of the node.

2. The node control circuit of claim 1, further comprising a sensing circuit, and a driving circuit configured to drive a device under test (DUT) through the sensing circuit, wherein the driving circuit is controlled by the voltage of the node.

3. The node control circuit of claim 2, further comprising a first feedback amplifier configured to provide feedback to the setting circuit based on one of a voltage across the sensing circuit or a voltage across the DUT, and a second feedback amplifier configured to provide feedback to the follower transistor clamp based on the other of the voltage across the sensing circuit or the voltage across the DUT.

4. The node control circuit of claim 1, wherein the node control circuit is further configured to change the voltage of the node substantially linearly with the set signal.

5. The node control circuit of claim 1, wherein the follower transistor clamp is a p-type follower clamp configured to receive an upper clamping control signal operable to adjust an upper voltage limit at which the p-type follower clamp activates to clamp the voltage of the node, the at least one clamping circuit further comprising an n-type follower clamp configured to receive a lower clamping control signal operable to adjust a lower voltage limit at which the n-type follower clamp activates to clamp the voltage of the node.

6. The node control circuit of claim 1, further comprising a control circuit configured to receive digital data over an interface, and to control the set signal and the clamping control signal based on the digital data.

7. The node control circuit of claim 1, wherein the setting circuit comprises a current source and a resistor in series, wherein at least one of a current of the current source of a resistance of the resistor is controllable.

8. The node control circuit of claim 1, wherein the follower transistor clamp comprises at least one of a source follower transistor or an emitter follower transistor.

9. The node control circuit of claim 8, wherein the follower transistor clamp comprises a double-diffused metal-oxide-semiconductor (DMOS) transistor source follower.

10. The node control circuit of claim 1, wherein the follower transistor clamp comprises at least one of a pair of cross-connected source follower transistors or a pair of cross-connected emitter follower transistors.

11. The node control circuit of claim 1, wherein the follower transistor clamp comprises a follower transistor including an output coupled to the node, the node control circuit further comprising an error amplifier operable to control an input to the follower transistor to compensate the voltage limit for a transistor offset of the follower transistor.

12. An electronic module comprising:
    a module substrate; and
    an amplifier die attached to the module substrate, the amplifier die comprising:
       a sensing circuit coupled to a load pin;
       a driving circuit configured to drive the load pin through the sensing circuit, the driving circuit controlled by a voltage of a node; and
       a node control circuit including a setting circuit configured to control the voltage of the node within a voltage range based on a set signal, and at least one clamping circuit configured to control the voltage range, the at least one clamping circuit comprising a follower transistor clamp configured to receive a clamping control signal operable to adjust a voltage limit at which the follower transistor clamp activates to clamp the voltage of the node.

13. The electronic module of claim 12, wherein the amplifier die further comprises a first feedback amplifier configured to provide feedback to the setting circuit based on one of a voltage across the sensing circuit or a voltage across a load coupled to the load pin, and a second feedback amplifier configured to provide feedback to the follower transistor clamp based on the other of the voltage across the sensing circuit or the voltage across the load.

14. The electronic module of claim 12, wherein the follower transistor clamp is a p-type follower clamp configured to receive an upper clamping control signal operable to adjust an upper voltage limit at which the p-type follower clamp activates to clamp the voltage of the node, the at least one clamping circuit further comprising an n-type follower clamp configured to receive a lower clamping control signal operable to adjust a lower voltage limit at which the n-type follower clamp activates to clamp the voltage of the node.

15. The electronic module of claim 12, wherein the amplifier die further comprises an interface and a control circuit configured to receive digital data over the interface, the control circuit further configured to control the set signal and the clamping control signal based on the digital data.

16. The electronic module of claim 12, wherein the follower transistor clamp comprises at least one of a pair of cross-connected source follower transistors or a pair of cross-connected emitter follower transistors.

17. A method of controlling a voltage operating range and set voltage of a node, the method comprising:
receiving a set signal indicating a desired operating voltage of a node;
setting a voltage of the node within a voltage range based on the set signal using a setting circuit; and
controlling the voltage range of the node using at least one clamping circuit, including adjusting a voltage limit provided by a follower transistor clamp based on a clamping control signal, and activating the follower transistor clamp to clamp the voltage of the node in response to the voltage of the node reaching the voltage limit.

18. The method of claim 17, further comprising driving a device under test using a driving circuit, and controlling the driving circuit using the voltage of the node.

19. The method of claim 17, wherein activating the follower transistor clamp further comprises clamping the voltage of the node using at least one of a pair of cross-connected source follower transistors or a pair of cross-connected emitter follower transistors.

20. The method of claim 17, wherein adjusting the voltage limit provided by the follower transistor clamp includes adjusting an upper voltage limit at which a p-type follower clamp activates to clamp the voltage of the node based on an upper clamping control signal, the method further comprising adjusting a lower voltage limit at which an n-type follower clamp activates to clamp the voltage of the node based on a lower clamping control signal.

* * * * *